United States Patent [19]

Izumi

[11] Patent Number: 4,952,888
[45] Date of Patent: Aug. 28, 1990

[54] PHASE LOCKED LOOP FOR DIRECT MODULATION

[75] Inventor: Hideo Izumi, Soma, Japan

[73] Assignee: Alps Electric Co., Ltd., Tokyo, Japan

[21] Appl. No.: 410,371

[22] Filed: Sep. 20, 1989

[30] Foreign Application Priority Data

Sep. 22, 1988 [JP] Japan ............................ 63-124102[U]

[51] Int. Cl.$^5$ ......................... H03C 3/06; H03L 7/085
[52] U.S. Cl. ...................................... 332/124; 331/8;
 331/17; 332/127
[58] Field of Search ............... 332/124, 127, 128, 146;
 331/17, 8

[56] References Cited

U.S. PATENT DOCUMENTS 4,500,857 2/1985 Bosselaers et al. ............... 331/17 X
4,745,372 5/1988 Miwa ............................... 331/17 X Primary Examiner—Siegfried H. Grimm
Attorney, Agent, or Firm—Guy W. Shoup; David W. Heid

[57] ABSTRACT

A PLL for direct modulation having a flat modulation characteristic in the audio frequency range is described. The PLL for the direct modulation comprises a voltage controlled oscillator whose oscillating frequency is controlled by an output voltage of a low pass filter and also modulated by a signal, a programmable frequency divider supplied with an output signal of the voltage controller oscillator or the output signal divided in frequency, and a phase comparator comparing an output frequency $f_p$ of the programmable frequency divider with a reference frequency $f_r$. The phase comparator outputs signals indicating three conditions in accordance with the results of the comparison: a first transistor turned ON by the output signal of the phase comparator indicating the condition $f_r > f_p$ for charging a capacitor within the low pass filter; a second transistor turned ON by the output signal of the phase comparator indicating the condition $f_r > f_p$ for constituting the discharging path of the capacitor within the low pass filter; and both transistors being turned OFF for the condition $f_r = f_p$. A delay means is inserted in the first transistor circuit for delaying the timing at which the first transistor turns ON. The delay mens causes the self resonant frequency of the PLL to be lowered.

6 Claims, 4 Drawing Sheets

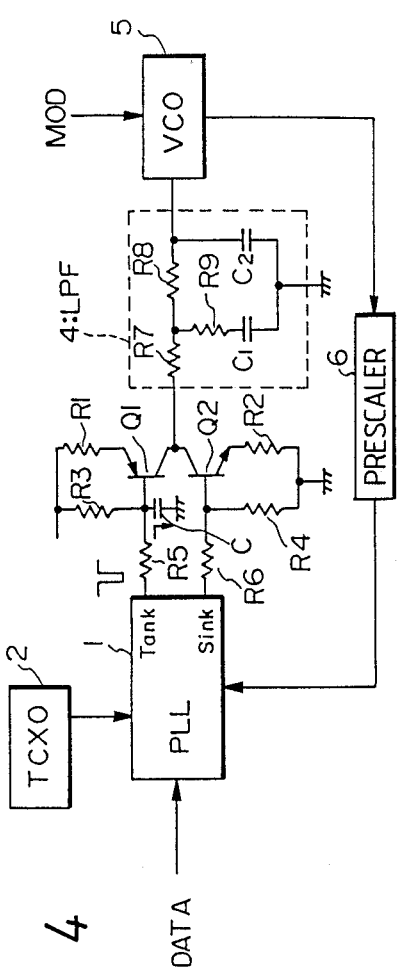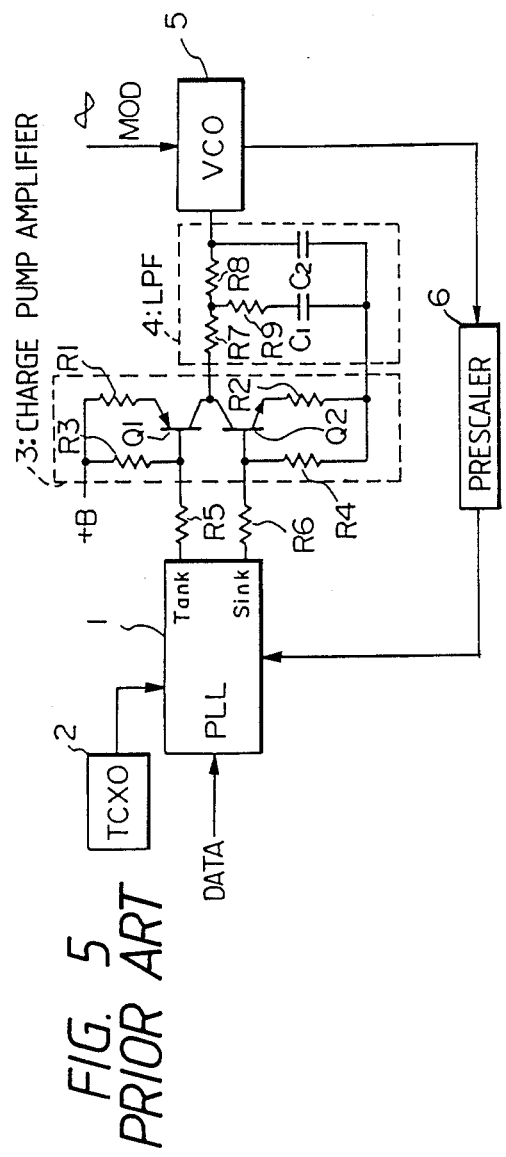
FIG. 4
FIG. 5
PRIOR ART

PHASE LOCKED LOOP FOR DIRECT MODULATION

BACKGROUND OF THE INVENTION

1. Field of the Invention

The present invention relates to a PLL (phase locked, loope) for direct modulation suitable for use, for example; in the transmitter for radio telephony.

2. Description of the Prior Art

In transmitters for use in mobile communication, frequency synthesizers employing a PLL are frequently used in the circuits for generating the carrier wave. In the modulation, although systems to frequency modulate an output signal of a reference frequency signal generator formed of the PLL have been generally used, currently direct modulation systems are used, in which the PLL is subjected to a frequency modulation. This is because the direct modulation system can be designed easily and cost reduction can thereby be achieved.

FIG. 5 is a block diagram showing a frequency synthesizer of the described type. Referring to the figure, reference numeral 1 denotes a PLL IC (for example, FUJITSU make MB87001A) composed of a programmable frequency divider, a phase comparator, and others. The PLL IC 1 is adapted such that its programmable frequency divider is supplied with data for establishing the frequency dividing ratio. The inputs of its phase comparator are supplied with an output signal (frequency $f_p$) of the above described programmable frequency divider and an oscillating output (reference frequency $f_r$) of an oscillator 2. The PLL IC is adapted to achieve three conditions: first, it brings its output Tank to high impedance and its output Sink to an "L" level when $f_p=f_r$; second, it brings both its outputs Tank and Sink to an "L" level when $f_r>f_p$; third, it brings its output Tank to high impedance and its output Sink to an "H" level when $f_r<f_p$. Reference numeral 3 denotes a charge pump amplifier portion, which is a circuit to shorten the charging and discharging times of capacitors within a low pass filter 4 to thereby shorten the lock-in time of the PLL. The charge pump amplifier 3 is composed of transistors Q1 and Q2, their emitter resistors R1 and R2, and resistors R3 and R4 inserted between the base and emitter of each thereof. The bases of the transistors Q1 and Q2 are connected with the outputs Tank and Sink through resistors R5 and R6, respectively, and the common collector of the transistors Q1 and Q2 is connected with the input of the low pass filter 4. The low pass filter 4 is composed of resistors R7 and R8 inserted in series between its input and output, a capacitor C2 inserted between its output and ground, and a resistor R9 and a capacitor C1 inserted in series between the junction of the resistors R7 and R8 and ground. Reference numeral 5 denotes a voltage controlled oscillator receiving an output voltage of the low pass filter 4 at its frequency controlling terminal. The voltage controlled oscillator 5 is adapted such that its output signal is modulated by a signal MOD. The output signal of the voltage controlled oscillator 5 is divided in frequency by a prescaler 6 and is supplied to the input of the programmable frequency divider circuit of the PLL IC 1.

The circuit shown in FIG. 5 is adapted such that, when $f_r>f_p$, both the outputs Tank and Sink of the PLL IC 1 go to an "L" level. The transistor Q1 is turned ON and the transistor Q2 is turned OFF so that the capacitors C1 and C2 are charged. As a result, the output voltage of the low pass filter 4 is raised, the output frequency of the voltage controlled oscillator 5 is increased, and thus, the frequency $f_p$ increases to come close to $f_r$. When $f_r<f_p$, the output Tank obtains high impedance and the output terminal Sink goes to an "H" level. The transistor Q1 is turned OFF, the transistor Q2 is turned ON, and the capacitors C1 and C2 are discharged. As a result, the output voltage of the low pass filter 4 is lowered, the output frequency of the voltage controlled oscillator 5 is decreased, and thus, the frequency $f_p$ comes close to $f_r$. When $f_p=f_r$, the output Tank of the PLL IC 1 obtains high impedance, the output Sink goes to an "L" level, and hence both the transistors Q1 and Q2 are turned OFF. As a result, the capacitors C1 and C2 are neither charged nor discharged and the output voltage of the low pass filter 4 remains uncharged. Thus, the output frequency of the voltage controlled oscillator 5 remains unchanged and the condition $f_p=f_r$ is maintained.

In the described manner, within the response range of the PLL, the circuit always functions such that the condition $f_p=f_r$ is attained.

As understood from the foregoing description, the circuit always functions such that the condition $f_p=f_r$ is attained within the response range of the PLL, and hence, the region of frequencies of the signal MOD at which modification is possible exists on the outside of the response range. As a consequence, a phase error response characteristic, as shown in FIG. 6 indicates the condition for modulation. The frequency $f_0$, shown in FIG. 6, represents the self-resonant frequency of the PLL (generally, 300–600 Hz). As apparent from FIG. 6, the frequency region in which good modulation is achieved is the region higher than the self-resonant frequency $f_0$ (the region indicated by the arrow). In the region lower than the self-resonant frequency the PLL tracks and suppresses the frequency variations produced by the frequency modulation to thereby suppress the frequency variations making good modulation unattainable. In this case, the self-resonant frequency $f_0$ is 300–600 Hz, while the frequency range of the signal MOD, when a voice signal for radio telephony or the like is treated, is in the so-called audio range from 300 Hz to 3 kHz. Accordingly, a flat modulating characteristic is not obtained at the lower frequencies of the signal MOD, so that voice signals, of the like, are not accurately transmitted. The ideal characteristic of the phase comparator within a PLL IC is such as shown by a solid line in FIG. 7. In actuality, the characteristic as indicated by dotted lines in FIG. 7 is obtained instead because of irregularity in the manufacture of semiconductors. Thus, a dead zone is produced around the frequency $f_0$ to be locked in. As a result, there has been a difficulty that no response is obtained to disturbances having a low frequency component such as the ripple of the power supply. Recently, a special design as created which elminates the dead zone and improves the response to external disturbing noises. This is shown in FIG. 8. However, when the dead zone of the phase comparator is eliminated, the self-resonant frequency $f_0$ of the PLL increases. As a result, the modulating characteristic in the audio frequency range becomes worse than before in the higher frequency region.

SUMMARY OF THE INVENTION

The present invention was made in view of the above described problems. Accordingly, an object of the present invention is to provide a PLL for direct modulation having a flat modulation characteristic in the audio frequency range.

In order to solve the above mentioned problems, the PLL for direct modulation according to the present invention comprises a voltage controlled oscillator whose oscillating frequency is controlled by an output voltage of a low pass filter and which is also modulated by a signal; a programmable frequency divider which is supplied with an output signal from the voltage controlled oscillator, or supplied with the output signal from the VCO divided in frequency and a phase comparator which compares an output frequency $f_p$ of the programmable frequency divider with a reference frequency $f_r$. The phase comparator outputs signal indicating three conditions in accordance with the results of the comparison: a first transistor is turned ON by the output signal of the phase comparator indicating the condition $f_r > f_p$ for charging a capacitor within the low pass filter; a second transistor is turned ON by the output signal of the phase comparator indicating the condition $f_r < f_p$ for constituting the discharging path of the capacitor within the low pass filter; and a delay means for delaying the timing at which the first transistor turns ON. The timing at which the first transistor is turned ON is delayed by the delay means and the self-resonant frequency of the PLL is lowered.

BRIEF DESCRIPTION OF THE DRAWINGS

FIG. 3 and FIG. 4 are circuit diagrams showing variations of the embodiment;

FIG. 5 is a circuit diagram showing an arrangement of a prior art direct modulation PLL circuit;

DETAILED DESCRIPTION OF THE PREFERRED EMBODIMENTS

An embodiment of the present invention will be described below with reference to the accompanying drawings.

Figure 1:
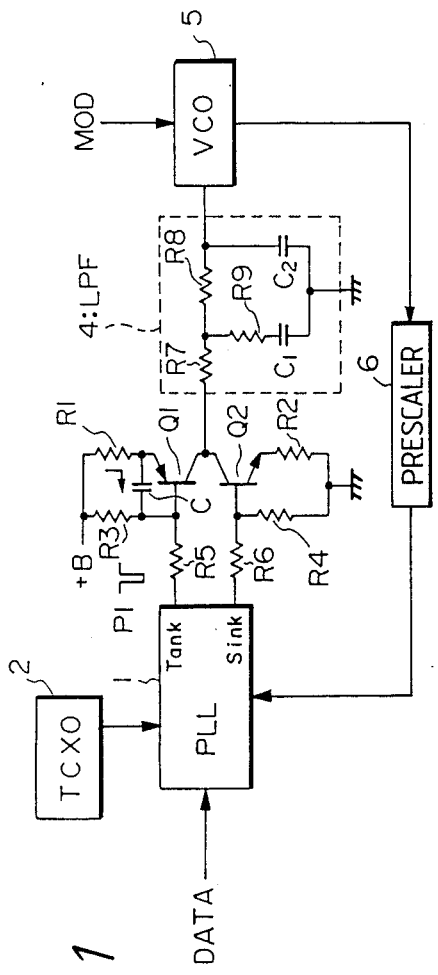
FIG. 1 is a circuit diagram showing an arrangement of an embodiment of the present invention.

FIG. 1 is a circuit diagram showing a principal portion of an embodiment of the present invention. The present embodiment differs from the conventional circuit shown in FIG. 5 in that a capacitor C is inserted between the emitter and base of the transistor Q1 of the present invention. Operation of the circuit with such a capacitor inserted will be described below.

When $f_r > f_p$, the terminal Tank of the PLL IC 1 goes to an "L" level. As a result, a current flows through the resistor R1, capacitor C, and the resistor R5. At this moment, the capacitor becomes conductive and the emitter and the base of the transistor Q1 obtain equal potential. The transistor Q1 is not turned ON and the capacitors C1 and C2 within the low pass filter 4 are not charged. The PLL will not perform the tracking operation as a PLL. When the capacitor C is charged gradually, a potential difference between the emitter and the base of the transistor Q1, is created and the transistor Q1 is turned ON. As a result, the capacitors C1 and C2 within the low pass filter 4 are charged thereby raising the output voltage of the low pass filter 4. The output frequency of the voltage controlled oscillator 5 is increased causing the PLL to lock and bring about the condition $f_p = f_r$. By providing the capacitor C, the time taken for the PLL to accomplish lock-in when $f_r > f_p$ is slightly delayed. In the present embodiment, the slight time delay corresponds to the vicinity of the self-resonant frequency $f_0$. Hence, the PLL becomes dead in the vicinity of the self-resonant frequency $f_0$ and the frequency range within which the PLL is capable of its tracking operation is confined to the frequency region lower than the self-resonant frequency $f_0$. In other words, the capacitor C lowers the self-resonant frequency $f_0$, and hence, even if $f_r > f_p$, resulting from the modulation, the PLL does not respond in the vicinity of $f_0$.

Figure 2:
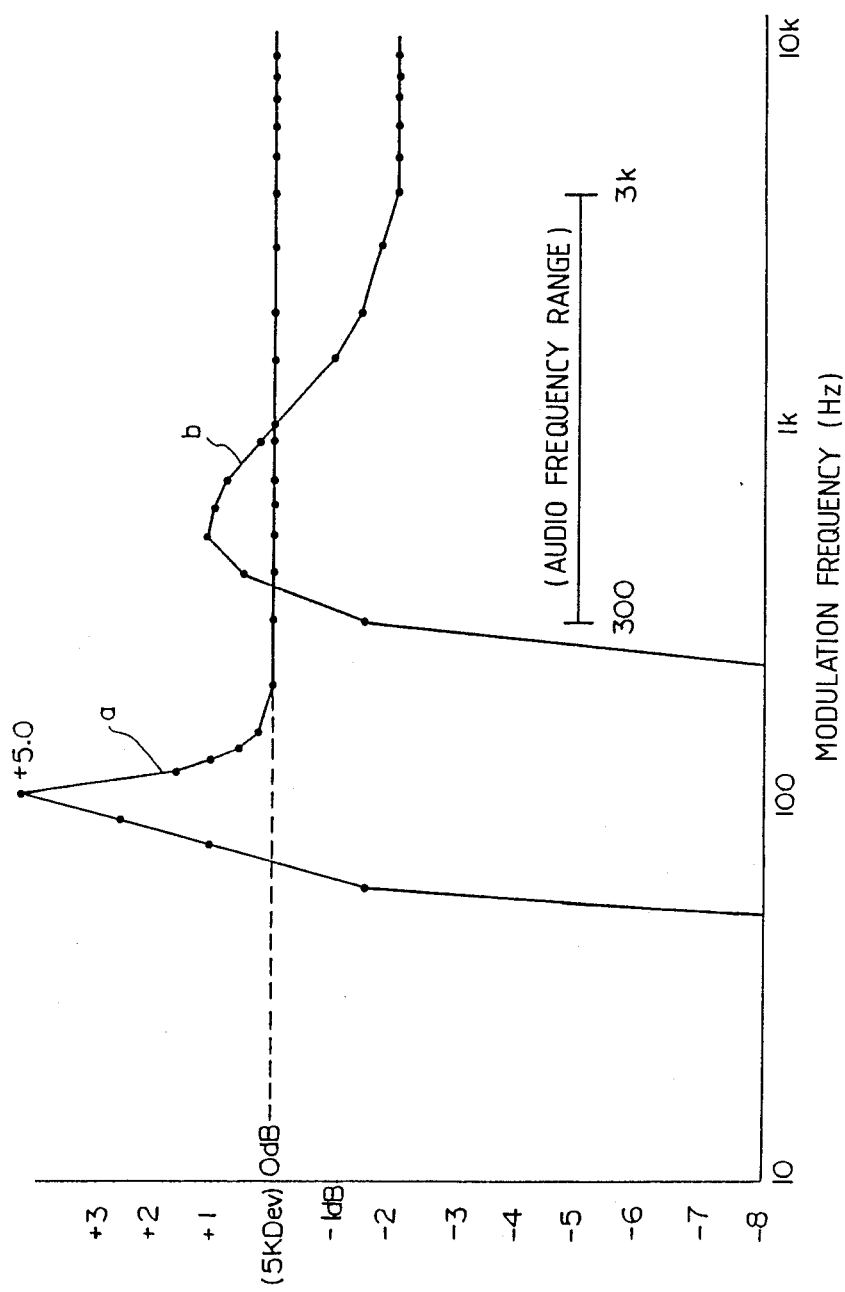
FIG. 2 is a curve showing a modulation characteristic of the embodiment.
Figure 6:
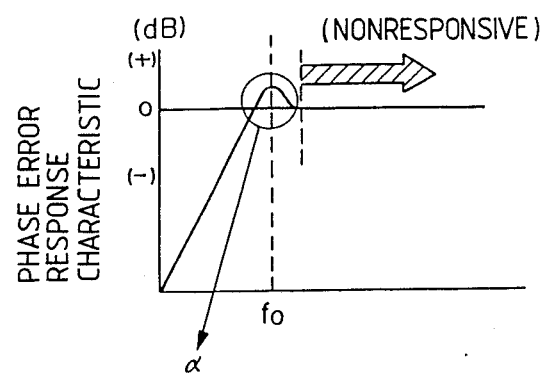
FIG. 6 is a curve showing a phase error response characteristic in a prior art circuit.
Figure 7:
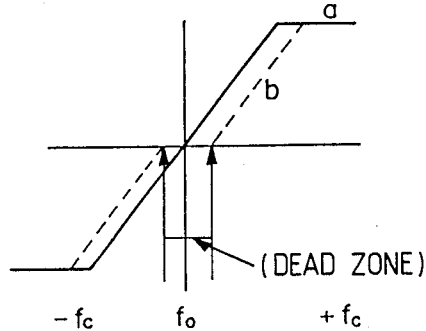
FIG. 7 and FIG. 8 are characteristic curves showing characteristics of phase comparators.
Figure 8:
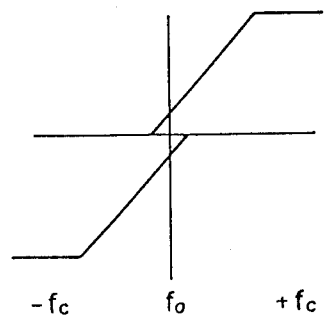

A phase error response characteristic in the present embodiment is shown in FIG. 2. Curve a in the figure is the characteristic of the embodiment with the capacitor C provided and the curve b is the characteristic in the case without the capacitor C provided. As apparent from the figure, the characteristic without the capacitor C provided has a large wavy portion in the signal frequency band (300 Hz–3 kHz), but that with the capacitor C provided, exhibits a flat characteristic even in the 300 Hz–3kHz signal frequency range.

Figure 3:
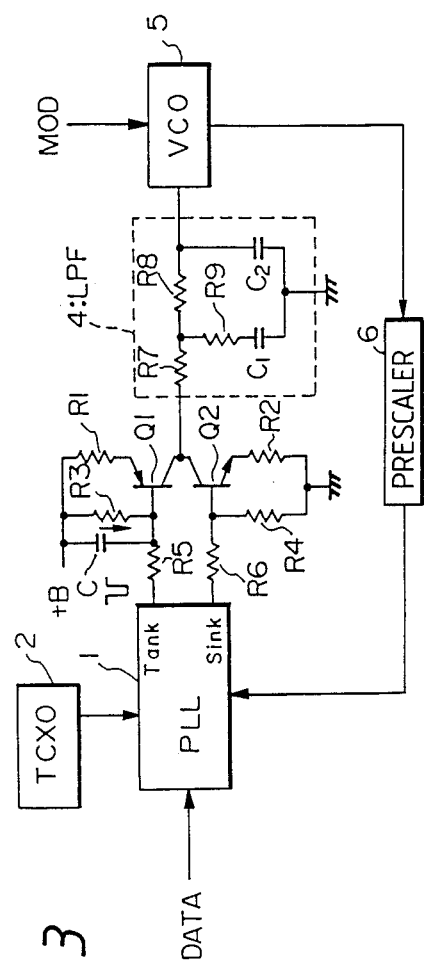

FIG. 3 and FIG. 4 are circuit diagrams showing variations of the above described embodiment. In the circuit shown in FIG. 3, the capacitor C is inserted between the base of the transistor Q1 and the power supply terminal, and in the circuit shown in FIG. 4, the capacitor C is inserted between the base of the transistor Q1 and ground. In the circuit shown in FIG. 3, immediately after the output Tank of the PLL IC 1 has reached an "L" level, the capacitor C becomes conductive and the base of the transistor Q1 ia brought to the same potential level as that of the power source. Hence, transistor Q1 turns ON after a slight delay. In the circuit shown in FIG. 4, capacitor C is charged before the output Tank reaches an "L" level, and immediately after the output Tank has reached the "L" level, capacitor C begins discharging. The base of transistor Q1 is within the same potential of the power sourve, creating a slight delay period the turning ON before the transistor Q1 turns ON.

Thus, in each embodiment of the present invention a slight delay period is created before transistor Q1 is turned ON.

The delay in the lock-in of the PLL in any of the above described embodiments is slight. As compared to the delay where the time constant of the low pass filter 4 is increased so as to lower the self-resonant frequency, the delay in the lock-in is virtually nil. The embodiments of the present invention permit lowering the self-resonant frequency $f_0$ while causing virtually no change in the lock-in time.

Accordingly, it is possible to lower the self-resonant frequency of a PLL, and flatten, the modulating characteristic in the modulating signal range.

What is claimed is:

1. A PLL for direct modulation comprising:
    A voltage controlled oscillator circuit having an input terminal for receiving a modulation signal, a control terminal for receiving a control voltage for controlling the frequency of oscillation of said circuit, and an output terminal for providing an output signal;
    a programmable frequency divider having an input terminal for receiving output signals from said voltage controlled oscillator and providing at an output terminal a signal having a frequency $f_p$;

means coupling the output terminal of said voltage controlled oscillator to the input terminal of said programmable frequency divider;

a reference frequency oscillator circuit for providing at an output terminal a signal having a frequency $f_r$;

a low pass filter circuit including capacitor means for storing an electrical charge, said filter circuit having an input terminal coupled to said capacitor means for providing a charging and discharging path for said capacitor means, and said low pass filter circuit having an output terminal coupled to said capacitor means for providing at said output terminal an electrical potential;

means coupling the output teminal of said low pass filter circuit to said control terminal of said voltage controlled oscillator circuit;

a power terminal and a ground terminal for application therebetween of an electrical potential;

a first transistor and a second transistor, each transistor having first and second terminals defining the ends of its main conduction path and a control terminal whose potential relative to said first terminal determines the conductivity of the transistor;

means coupling the first terminal of said first transistor to said power terminal;

means coupling the second terminal of said first transistor to said input terminal of said low pass filter circuit;

means coupling the first terminal of said second transistor to said ground terminal;

means coupling the second terminal of said second transistor to said input terminal of said low pass filter circuit;

a phase comparator circuit having a first input terminal coupled to the output terminal of said programmable frequency divider for receiving output signals from said programmable frequency divider, a second input terminal coupled ot the output terminal of said reference frequency oscillator circuit for receiving reference frequency signals, said phase comparator circuit having a first output terminal coupled to the control terminal of said first transistor, a second output terminal coupled to the control terminal of said second transistor, said phase comparator circuit including circuit means for comparing the frequency $f_p$ of the signals received from said programmable frequency divider with the frequency $f_r$ of the signals received from said reference frequency oscillator and when $f_r > f_p$ providing at the first output of said phase comparator a signal which causes said first transistor to conduct and thereby charge said capacitor means in said low pass filter, and when $f_r > f_p$ providing at the second output terminal of said phase comparator circuit a signal which causes said second transistor to conduct and thereby provide a discharging path for said capacitor means in said low pass filter circuit; and delay circuit means coupled to said first transistor to provide a time delay in the start of conduction of said first transistor.

2. A PLL for direct modulation according to claim 1, wherein said first and second transistors are bipolar transistors, each having a base, a collector and an emitter terminal, and wherein the first terminal of said transistors is an emitter terminal, said secod terminal is a collector terminal and said control terminal is a base terminal.

3. A PLL according to claim 2, wherein said delay means comprises a capacitor having first and second terminals, and said PLL further includes means coupling the first terminal of said capacitor to the base of said first transistor and means coupling the second terminal of said capacitor to said emitter of said first transistor.

4. A PLL according to claim 2, wherein said delay means comprises a capacitor having first and second terminals, and said PLL further includes means coupling the first terminal of said capacitor to the base of said first transistor and means coupling the second terminal of said capacitor to said power terminal.

5. A PLL according to claim 2, wherein said delay means comprises a capacitor having first and second terminals, and said PLL further includes means coupling the first terminal of said capacitor to the base of said first transistor and means coupling the second terminal of said capacitor to said ground terminal.

6. A PLL according to claim 1, wherein said means coupling the output terminal of said voltage controlled oscillator to the input terminal of said programmable frequency divider includes circuit means for frequency dividing signals received from said voltage controlled oscillator and providing said frequency divided signals to said programmable frequency divider.

* * * * *

UNITED STATES PATENT AND TRADEMARK OFFICE
CERTIFICATE OF CORRECTION

PATENT NO. : 4,952,888
DATED : August 28, 1990
INVENTOR(S) : Hideo Izumi

It is certified that error appears in the above-identified patent and that said Letters Patent is hereby corrected as shown below:

Abstract
  Line 8, "controller" should read --controlled--
  Line 18, "$f_r > f_p$" should read --$f_r < f_p$--
  Line 23, "mens" should read --means--

Col. 5 Line 16
  "teminal" should read --terminal--

Col. 6 Line 6
  "$f_r > f_p$" should read --$f_r < f_p$--

Col. 6 Line 19
  "secod" should read --second--

Signed and Sealed this

Twenty-fifth Day of February, 1992

Attest:

HARRY F. MANBECK, JR.

*Attesting Officer*     *Commissioner of Patents and Trademarks*